US011341766B2

(12) United States Patent
Gu et al.

(10) Patent No.: US 11,341,766 B2
(45) Date of Patent: May 24, 2022

(54) OPTICAL STRUCTURE, DISPLAY SUBSTRATE AND DISPLAY DEVICE

(71) Applicant: BOE TECHNOLOGY GROUP CO., LTD., Beijing (CN)

(72) Inventors: Pinchao Gu, Beijing (CN); Xue Dong, Beijing (CN); Haisheng Wang, Beijing (CN); Yingming Liu, Beijing (CN); Rui Xu, Beijing (CN); Changfeng Li, Beijing (CN); Yuzhen Guo, Beijing (CN); Lijun Zhao, Beijing (CN); Yanan Jia, Beijing (CN); Yunke Qin, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 640 days.

(21) Appl. No.: 16/327,939

(22) PCT Filed: Aug. 14, 2018

(86) PCT No.: PCT/CN2018/100403
§ 371 (c)(1),
(2) Date: Feb. 25, 2019

(87) PCT Pub. No.: WO2019/047678
PCT Pub. Date: Mar. 14, 2019

(65) Prior Publication Data
US 2021/0357616 A1 Nov. 18, 2021

(30) Foreign Application Priority Data
Sep. 7, 2017 (CN) .......................... 201710801654.8

(51) Int. Cl.
G06V 40/13 (2022.01)
H01L 27/32 (2006.01)
(Continued)

(52) U.S. Cl.
CPC ........ G06V 40/1324 (2022.01); G06V 10/145 (2022.01); G06V 10/147 (2022.01); H01L 27/3234 (2013.01)

(58) Field of Classification Search
None
See application file for complete search history.

(56) References Cited

U.S. PATENT DOCUMENTS

2017/0221960 A1 8/2017 Lin et al.
2018/0239454 A1 8/2018 Wu et al.
(Continued)

FOREIGN PATENT DOCUMENTS

CN 104317060 A 1/2015
CN 106066742 A 11/2016
(Continued)

OTHER PUBLICATIONS

International Search Report and Written Opinion for Application No. PCT/CN2018/100403, dated Nov. 12, 2018, 11 Pages.

Primary Examiner — Nicholas J Lee
(74) Attorney, Agent, or Firm — Brooks Kushman P.C.

(57) ABSTRACT

An optical structure, a display substrate and a display device are provided. The optical structure includes a first medium layer being transparent and an opaque layer which is arranged on the first medium layer and includes a plurality of vias. The optical structure is configured to allow light rays passing through each of the plurality of via to project to a corresponding light ray receiving area respectively.

18 Claims, 8 Drawing Sheets

(51) Int. Cl.
*G06V 10/145* (2022.01)
*G06V 10/147* (2022.01)

(56) References Cited

U.S. PATENT DOCUMENTS

| | | |
|---|---|---|
| 2018/0357459 A1 | 12/2018 | Ling et al. |
| 2018/0373945 A1* | 12/2018 | Wu .................... G02B 27/0988 |
| 2020/0285826 A1 | 9/2020 | Gu et al. |

FOREIGN PATENT DOCUMENTS

| | | |
|---|---|---|
| CN | 106203408 A | 12/2016 |
| CN | 106886341 A | 6/2017 |
| CN | 106980850 A | 7/2017 |
| CN | 107068704 A | 8/2017 |
| CN | 107423728 A | 12/2017 |
| CN | 207367230 U | 5/2018 |

* cited by examiner

OPTICAL STRUCTURE, DISPLAY SUBSTRATE AND DISPLAY DEVICE

CROSS-REFERENCE TO RELATED APPLICATIONS

This application is the U.S. national phase of PCT Application No. PCT/CN2018/100403 filed on Aug. 14, 2018, which claims priority to Chinese Patent Application No. 201710801654.8 filed on Sep. 7, 2017, which are incorporated herein by reference in their entireties.

TECHNICAL FIELD

The present disclosure relates to the field of display technologies, for example, to an optical structure, a display substrate and a display device.

BACKGROUND

During a process of obtaining an optical image, a too large distance between an object and an optical sensing unit cause an obtained optical image blurry. Also, there is interference between obtained light rays of the object, and a sharp image of the object cannot be obtained.

SUMMARY

An optical structure, including:
a first medium layer being transparent; and
an opaque layer, arranged on the first medium layer and including a plurality of vias;
where the optical structure is configured to allow light rays passing through each of the plurality of vias to project to a corresponding light ray receiving area respectively.

In some embodiments, the opaque layer includes:
a first opaque sub-layer, arranged on a first surface of the first medium layer and including a plurality of first vias; and
a second opaque sub-layer arranged on a second surface of the first medium layer, where the second surface is opposite to the first surface, and the second opaque sub-layer includes a plurality of second vias;
where an orthogonal projection of one first via of the plurality of first vias onto the first medium layer partially or completely overlaps with an orthogonal projection of one second via of the plurality of second vias onto the first medium layer, and the second via of the plurality of second vias is closest to the first via of the plurality of first vias.

In some embodiments, the optical structure further includes a second medium layer being transparent, where the second medium layer is located at a light-exiting side of the first medium layer;
the optical structure meets the following condition:

$$\frac{n_1}{n_2} \geq \sqrt{1+\left(\frac{h}{L-d}\right)^2},$$

$n_1$ is a refractive index of the first medium layer, $n_2$ is a refractive index of the second medium layer, h is a thickness of the first medium layer, L is a period of the plurality of vias, d is an aperture of each of the plurality of vias, and $n_1$ is greater than $n_2$.

In some embodiments, the opaque layer includes at least two medium sub-layers, the third opaque sub-layer is arranged between every two adjacent medium sub-layers of the at least two medium sub-layers, the third opaque sub-layer includes a plurality of third vias, and orthogonal projections of one third via of the plurality of third vias, one second via of the plurality of second vias and one first via of the plurality of first vias, onto the first medium layer partially or completely overlap with one another.

In some embodiments, the optical structure further includes a second medium layer being transparent, where the second medium layer is located at a light-exiting side of the first medium layer, and the first medium layer includes m medium sub-layers;
the optical structure meets the following condition:

$$\frac{n_1}{n_2} \geq \sqrt{1+\left(\frac{h}{mL-d}\right)^2},$$

where all the m medium sub-layers have a refractive index of $n_1$, $n_2$ is a refractive index of the second medium layer, h is a thickness of the first medium layer, L is a period of the plurality of vias, d is an aperture of each of the plurality of vias, $n_1$ is greater than $n_2$, and m is greater than or equal to 2.

In some embodiments, 25 µm≤L≤50 µm.

In some embodiments, the at least two medium sub-layers have a same thickness.

In some embodiments, distances between every two adjacent vias of the plurality of vias in the opaque layer are the same.

In some embodiments, the first medium layer is made of glass or polyimide.

A display substrate, including a base substrate and the above-mentioned optical structure, where the optical structure is arranged on the base substrate.

In some embodiments, the first medium layer serves as the base substrate.

In some embodiments, the base substrate includes an array structure, and the optical structure is arranged on one side of the base substrate away from the array structure.

In some embodiments, the display substrate includes an organic light-emitting diode (OLED) display substrate or a quantum-dot light-emitting diode (QLED) display substrate.

In some embodiments, the opaque layer includes:
a first opaque sub-layer, arranged on a first surface of the first medium layer and including a plurality of first vias; and
a second opaque sub-layer arranged on a second surface of the first medium layer, where the second surface is opposite to the first surface, and the second opaque sub-layer includes a plurality of second vias;
where an orthogonal projection of one first via of the plurality of first vias onto the first medium layer partially or completely overlaps with an orthogonal projection of one second via of the plurality of second vias onto the first medium layer, and the second via of the plurality of second vias is closest to the first via of the plurality of first vias.

In some embodiments, the optical structure further includes a second medium layer being transparent,
where the second medium layer is located at a light-exiting side of the first medium layer;
the optical structure meets the following condition:

$$\frac{n_1}{n_2} \geq \sqrt{1+\left(\frac{h}{L-d}\right)^2},$$

$n_1$ is a refractive index of the first medium layer, $n_2$ is a refractive index of the second medium layer, h is a thickness of the first medium layer, L is a period of the plurality of vias, d is an aperture of each of the plurality of vias, and $n_1$ is greater than $n_2$.

In some embodiments, the opaque layer includes a third opaque sub-layer, the first medium layer includes at least two medium sub-layers, the third opaque sub-layer is arranged between every two adjacent medium sub-layers of the at least two medium sub-layers, the third opaque sub-layer includes a plurality of third vias, and orthogonal projections of one third via of the plurality of third vias, one second via of the plurality of second vias and one first via of the plurality of first vias, onto the first medium layer partially or completely overlap with one another.

In some embodiments, the optical structure further includes a second medium layer being transparent, where the second medium layer is located at a light-exiting side of the first medium layer, and the first medium layer includes m medium sub-layers;

the optical structure meets the following condition:

$$\frac{n_1}{n_2} \geq \sqrt{1 + \left(\frac{h}{mL - d}\right)^2},$$

where all the m medium sub-layers have a refractive index of $n_1$, $n_2$ is a refractive index of the second medium layer, h is a thickness of the first medium layer, L is a period of the plurality of vias, d is an aperture of each of the plurality of vias, $n_1$ is greater than $n_2$, and m is greater than or equal to 2.

In some embodiments, 25 μm≤L≤50 μm.

In some embodiments, distances between every two adjacent vias of the plurality of vias in the opaque layer are the same.

A display device, including:

the above-mentioned display substrate;

a plurality of optical sensing units, configured to receive light rays reflected by an object to be detected and passing through the display substrate and the optical structure, where each of the plurality of optical sensing units is arranged in a corresponding light ray receiving area respectively; and a control unit, connected with the plurality of optical sensing units and configured to obtain a pattern of the object to be detected according to the light rays received by the plurality of optical sensing units.

DETAILED DESCRIPTION

In combination with FIGS. 1, 2, 3 and 4B, some embodiments provide an optical structure configured to obtain an optical image of an object.

The optical structure includes an opaque layer 1 and a first medium layer 2 which is transparent.

The opaque layer 1 is arranged on the first medium layer 2, and the opaque layer 1 includes a plurality of vias 4.

In some embodiments, the first medium layer 2 which is transparent refers to a medium layer passing through 60% or more of light which enters into the medium layer.

The optical structure is configured to allow light rays passing through each via 4 to project to a corresponding light ray receiving area 101 respectively. The via 4 is arranged to limit an angle which is a maximum angle between light rays projecting to the light ray receiving area 101 to be α.

In the above-mentioned optical structure, by arranging the opaque layer with a plurality of vias and allowing the light rays passing through each via to project to a corresponding light ray receiving area respectively, interference of light rays passing through different vias is avoided at a light ray receiving side, and the light rays passing through each via are individually detected.

In the condition that the optical structure according to the above-mentioned embodiments is arranged in an optical image obtaining device, an optical sensing unit arranged in the light ray receiving area receives light rays passing through corresponding vias. Since there is not interference between light rays passing through different vias, a sharp image of the object is obtained. The vias limits the maximum angle between light rays reflected by the object projecting to the optical sensing unit, and reduces a distance between the object and the optical sensing unit, which decreases the thickness of a whole module.

In some embodiments, the display device including the above-mentioned optical structure obtains a fingerprint image of a user when the user touches a display screen, identifies a fingerprint and performs corresponding operations, such as unlocking.

In some embodiments, distances between every two adjacent vias 4 in the opaque layer 1 are the same, to realize uniform distribution of light rays passing through the opaque layer 1. Evenness of an optical image obtained from the display device which includes the above-mentioned optical structure, and a quality of the optical image are improved.

Figure 1:
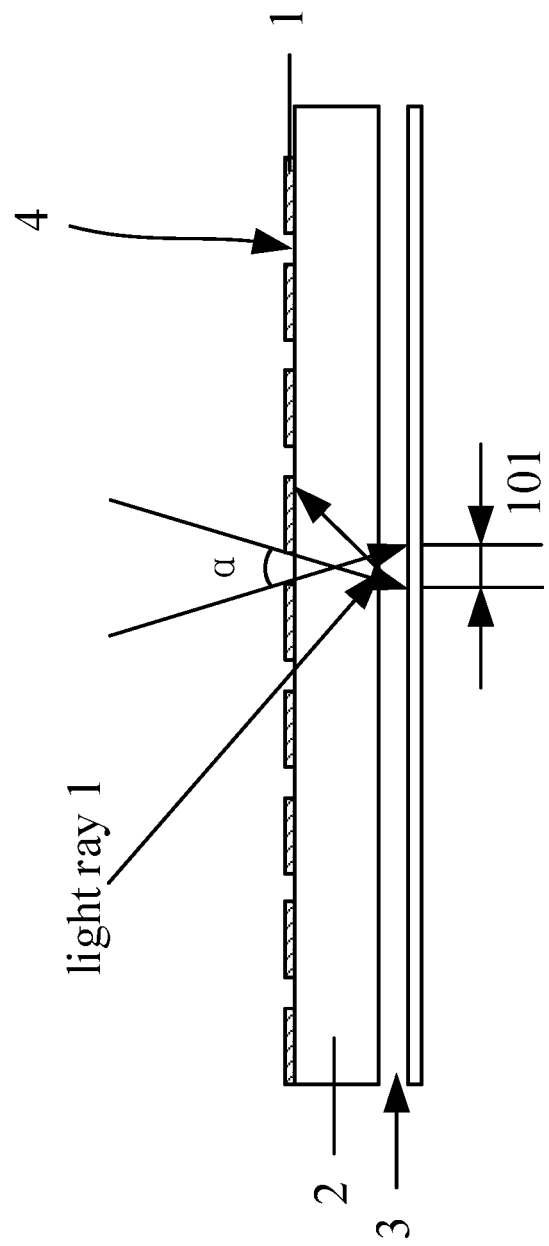
FIG. 1 is a schematic diagram of an optical structure according to some embodiments.
Figure 2:
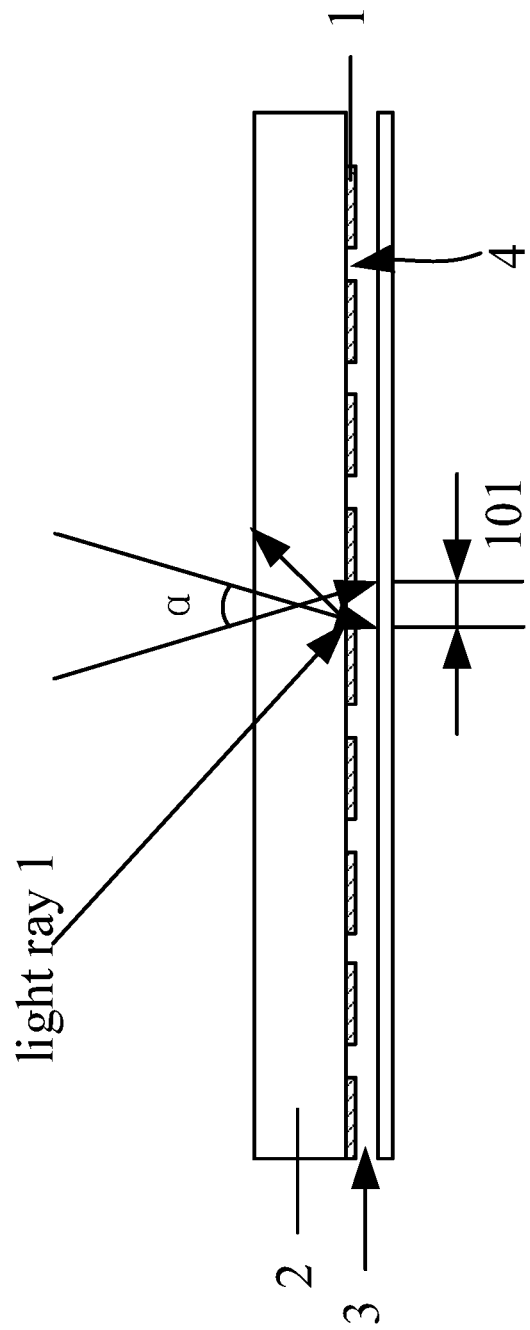
FIG. 2 is a schematic diagram of an optical structure according to other embodiments.
Figure 3:
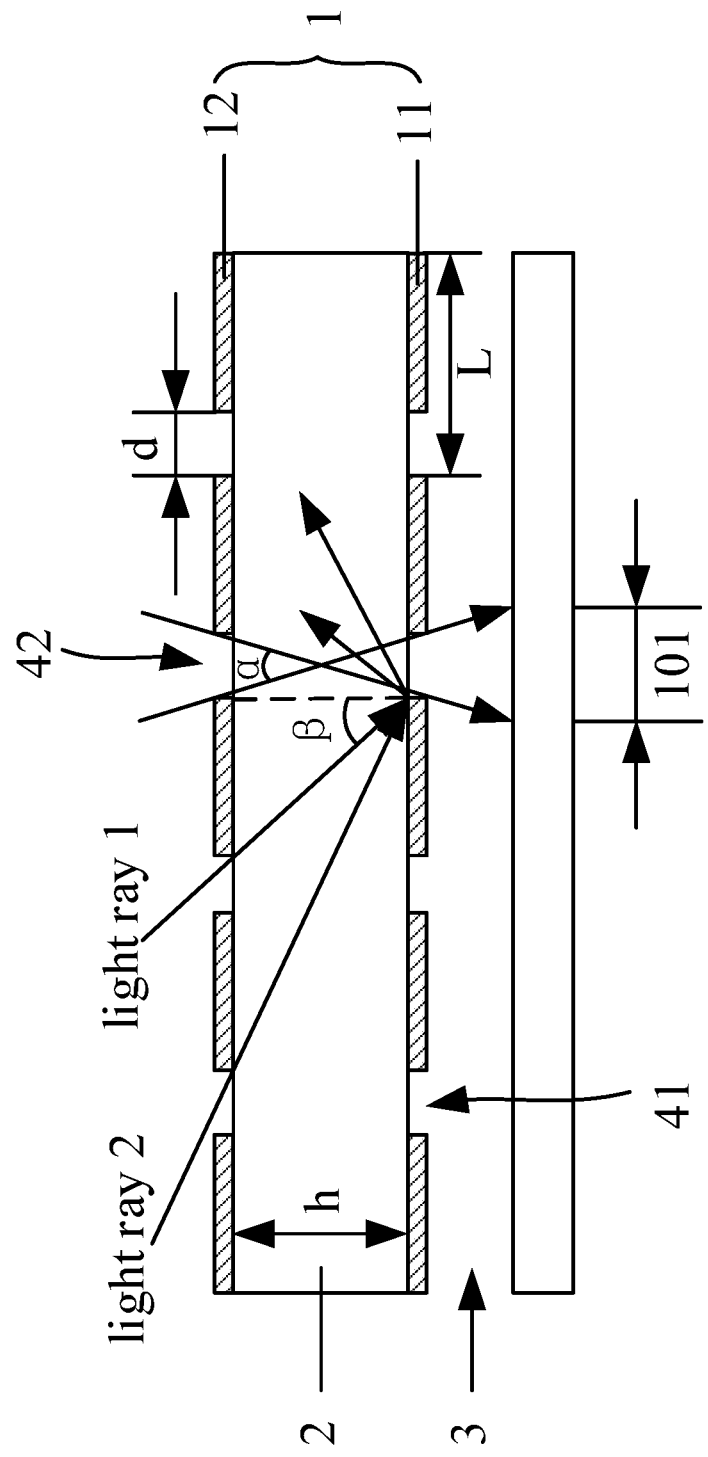
FIG. 3 is a schematic diagram of an optical structure according to other embodiments.

In some embodiments, as shown in FIG. 3, the opaque layer 1 includes a first opaque sub-layer 11 and a second opaque sub-layer 12.

The first opaque sub-layer 11 is arranged on a first surface of the first medium layer 2, and the first opaque sub-layer 11 includes a plurality of first vias 41.

The second opaque sub-layer 12 is arranged on a second surface, opposite to the first surface, of the first medium layer 2, and the second opaque sub-layer 12 includes a plurality of second vias 42.

In some embodiments, an orthogonal projection of the first via 41 onto the first medium layer completely overlaps with an orthogonal projection of the second via 42 closest to the first via 41 onto the first medium layer. That is, the first via 41 and the second via 42 have the same opening size. In some embodiments, an orthogonal projection of the first via 41 onto the first medium layer partially overlaps with an orthogonal projection of the second via 42 closest to the first via onto the first medium layer. That is, the first via 41 and the second via 42 have different opening sizes. The opening sizes of the first via 41 and the second via 42 are set according to the angle α which is a maximum angle between light rays projecting to the light ray receiving area.

The vias in the opaque layer 1 include a first via 41 and a second via 42 which correspond to each other in position.

The above-mentioned opaque layer includes two opaque sub-layers, vias in one opaque sub-layer of the two opaque sub-layers correspond to vias in another opaque sub-layer of the two opaque sub-layers, and light rays projecting to the light ray receiving area pass through two vias in the two opaque sub-layers. Since the opening sizes of the vias of the two opaque sub-layers and a distance between the two opaque sub-layers are controllable, the angle α which is a maximum angle between light rays projecting to the light ray receiving area is better controlled, and a distribution accuracy of obtained light rays is adjusted. Applying the above-mentioned optical structure to the optical image obtaining device contributes to improvements of an obtaining accuracy and a quality of the optical image.

In some embodiments, distances between every two adjacent first vias 41 of the first opaque sub-layer 11 are the same, and distances between every two adjacent second vias 42 of the second opaque sub-layer 12 are the same, realizing uniform distribution of light rays passing through the opaque layer 1. Applying the above-mentioned optical structure to the optical image obtaining device improves the evenness of the optical image obtained from the display device and the quality of the optical image.

In above-mentioned embodiments, the optical structure lead light rays passing through each via to project to a light ray receiving area corresponding to the each via, which avoids interference between light rays passing through different vias.

In some embodiments, the optical structure further includes a second medium layer 3 which is transparent.

The second medium layer 3 which is transparent is located at a light-exiting side of the first medium layer 2.

A refractive index $n_1$ of the first medium layer 2 is greater than a refractive index $n_2$ of the second medium layer 3, such that the light rays passing through other vias cannot project to a light ray receiving area 101 corresponding to one via (except the other vias) in the opaque layer 1 due to total reflection. For example, the light rays 1 in drawings cannot project to a light receiving area 101 corresponding to one via due to the light rays 1 being totally reflected on an interface between the first medium layer 2 and the second medium layer 3.

By arranging the opaque layer with a plurality of vias, the above-mentioned optical structure limits the angle which is a maximum angle between light rays projecting to the light ray receiving area. The second medium layer which is transparent is arranged at a light-exiting side of the first medium layer. With the total reflection principle, the light rays passing through other vias cannot project to a light ray receiving area corresponding to one via (except the other vias) due to the total reflection, thereby avoiding interference between light rays passing through different vias, and individually detecting light rays projecting to each light ray receiving area.

In some embodiments, the first medium layer 2 is a glass layer with a refractive index $n_1$ of 1.5, or a polyimide layer with a refractive index ranging from 1.8 to 1.9. In some embodiments, the second medium layer 3 is an air layer (that is, the third medium layer 3 is air). Since the refractive index $n_2$ of the air layer 3 is 1, light rays incident from the side where the first medium layer 2 is located are totally reflected on an interface between the first medium layer 2 and the second medium layer 3. The air layer is not necessarily manufactured by a separate process, thereby simplifying the process and lowering costs.

In some embodiments, the second medium layer is made of a transparent material with a refractive index less than that of the first medium layer.

In one embodiment, the optical structure includes an opaque layer 1 as well as a first medium layer 2 and a second medium layer 3 which are transparent and disposed opposite to each other.

The opaque layer 1 is of a double-layer structure, including a first opaque sub-layer 11 and a second opaque sub-layer 12.

The first opaque sub-layer 11 is arranged between the first medium layer 2 and the second medium layer 3, and the first opaque sub-layer 11 includes a plurality of first vias 41.

The second opaque sub-layer 12 is arranged at one side of the first medium layer 12 away from the second medium layer 3, and the second opaque sub-layer 12 includes a plurality of second vias 42.

The orthogonal projections of the first via 41 and the second via 42 closest to the first via onto the first medium layer 2 overlap partially or completely.

The optical structure meets the following condition:

$$\frac{n_1}{n_2} \geq \sqrt{1 + \left(\frac{h}{L-d}\right)^2}, \qquad 1)$$

where $n_1$ is a refractive index of the first medium layer 2, $n_2$ is a refractive index of the second medium layer 3, h is a thickness of the first medium layer 2, L is a period of the via (i.e., L=an aperture of one via+a width of one opaque layer adjacent to this via in a plane direction parallel with the medium layer), d is an aperture of the via, and $n_1$ is greater than $n_2$.

In the above-mentioned embodiment, by setting refractive indexes of the first medium layer and the second medium layer to meet the above-mentioned formula 1), light rays passing through other vias cannot project to a light ray receiving area corresponding to one via (except the other vias) in the opaque layer due to the total reflection, thereby avoiding interference between light rays passing through different vias at a light ray receiving side. Meanwhile, by setting the opaque layer to be of a double-layer structure, the angle α is better controlled, and a distribution accuracy of obtained light rays is adjusted.

The derivation principle of the above-mentioned formula 1) is as follows.

In order to avoid light rays (such as light rays 1 and 2) passing through other vias not projecting to a light ray receiving area corresponding to one via (except the other vias) in the opaque layer, β is greater than or equal to C, where C is a critical angle. That is, the total reflection occurs if an incidence angle of light rays onto the interface between the first medium layer 2 and the second medium layer 3 is greater than or equal to C.

With the trigonometric function relationships $\tan \beta \geq \tan C$, $\sin C = n_2/n_1$, and $\tan \beta = (L-d)/h$, the following is obtained:

$$\frac{n_1}{n_2} \geq \sqrt{1 + \left(\frac{h}{L-d}\right)^2}, \qquad 1)$$

where $n_1$ is a refractive index of the first medium layer 2, $n_2$ is a refractive index of the second medium layer 3, h is a thickness of the first medium layer 2, L is a period of the via in the opaque layer 1, and d is an aperture of the via.

In some embodiments, an aperture of the first via 41 and an aperture of the second via 42 are the same.

In above embodiments, only when the formula 1) is satisfied, the total reflection principle can be used to avoid the interference between light rays passing through different vias at the light ray receiving side. When the total reflection principle is applied to obtaining an optical image, if the value of L is too large, the optical image is not obtained accurately. For example, an object to be detected is fingerprint, and the distance between a valley and a ridge of the fingerprint ranges from 200 μm to 300 μm, so a value of L is less than 200 μm. In order to obtain fingerprint patterns more accurately and improve safety, the value of L ranges from 25 μm to 50 μm. When a value of h is 100 μm, much greater than (L−d), a numerical value of $$\sqrt{1 + \left(\frac{h}{L-d}\right)^2}$$

is relatively large, much greater than 2. Since a specific value of the refractive index between materials is not usually much greater than 2, it is difficult to find suitable materials to make the first medium layer and the second medium layer.

In some embodiments, the opaque layer 1 is of a multi-layer structure, including at least three opaque sub-layers. At least one opaque sub-layer between two outmost opaque sub-layers forms a barrier, such that light rays passing through some vias cannot project to the light ray receiving area corresponding to some other vias due to a block of the at least one opaque sub-layer even if the light rays passing through the some vias are not totally reflected.

Figure 5:
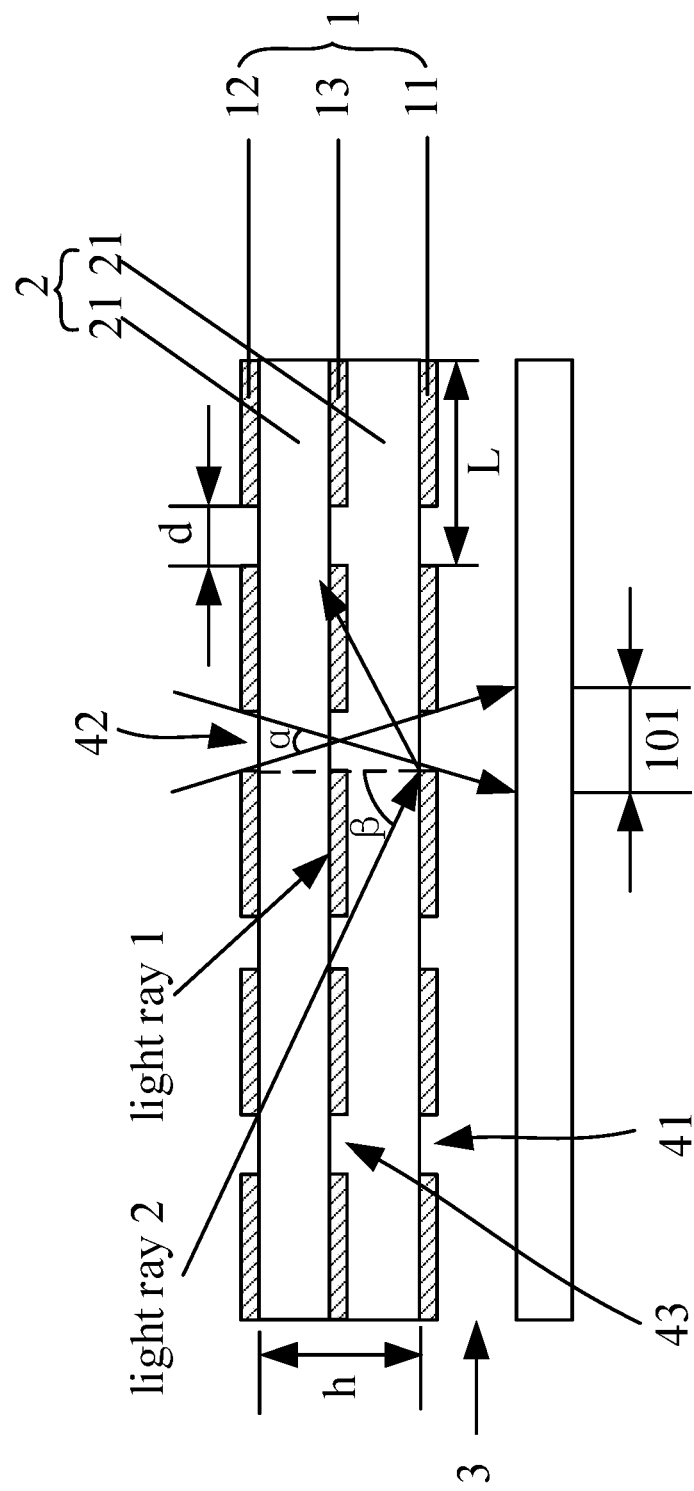
FIG. 5 is a schematic diagram of an optical structure according to other embodiments.

Specifically, based on the above-mentioned embodiments, in some embodiments, referring to FIG. 5, the first medium layer 2 includes at least two medium sub-layers 21, a third opaque sub-layer 13 is arranged between the two adjacent medium sub-layers 21, and the third opaque sub-layer 13 includes a plurality of third vias 43. The orthogonal projections of the first via 43, the second via 42 and the first via 41 onto the first medium layer overlap partially or completely.

Vias in the opaque layer 1 include a first via 41, a second via 42 and a third via 43 which correspond to one another.

An opening size of the third via 43 is not less than those of the first via 41 and the second via 42, so as not to affect an angle α which is a maximum angle between light rays passing through the first via 41 and the second via 42 and projecting to the light ray receiving area 101.

In the above-mentioned technical solution, by arranging at least one third opaque sub-layer between the first opaque sub-layer and the second opaque sub-layer, and arranging a third via at a position corresponding to the via in the third opaque sub-layer, in the premise of not affecting an angle α which is a maximum angle between light rays passing through the first opaque sub-layer and the second opaque sub-layer and projecting to the light ray receiving area, the third opaque sub-layer works as a barrier for blocking light rays (such as light ray 1 in FIG. 5) passing through some vias from projecting to an light ray receiving area corresponding to one via other than the some vias, which reduce some limitations of the first medium layer and the second medium layer in terms of material selection.

In some embodiments, all medium sub-layers 21 of the first medium layer 2 have a same thickness. In some embodiments, only one third opaque sub-layer 13 is arranged between the first opaque sub-layer 11 and the second opaque sub-layer 12, which reduces the aperture of the third via 43, enhances the effects of the third opaque sub-layer 13 blocking light rays, and makes it easier to prevent light rays passing through other vias from projecting to a light ray receiving area corresponding to one via (except the other vias) using the total reflection principle.

In some embodiments, in the case that at least two third opaque sub-layers 13 are arranged between the first opaque sub-layer 11 and the second opaque sub-layer 12, a distance between the first opaque sub-layer 11 and one third opaque sub-layers 13 adjacent the first opaque sub-layer 11, a distance between every two adjacent third opaque sub-layers 13 of the at least two third opaque sub-layers 13, and a distance between the second opaque sub-layer 12 and one third opaque sub-layers 13 adjacent the second opaque sub-layer 12 are the same, which contributes to the reduction of the apertures of the third vias 43 of all third opaque sub-layers 13.

In some embodiments, at least two medium sub-layers 21 of the first medium layer 2 have a same refractive index. In some embodiments, the at least two medium sub-layers 21 of the first medium layer 2 have different refractive indexes. A refractive index of a medium sub-layer 21 in contact with the second medium layer 3 is greater than that of the second medium layer 3.

As shown in FIG. 5, the optical structure will be introduced below by taking the opaque layer with a three-layer structure as an example.

Light rays passing through vias in the opaque layer 1 project to the light ray receiving area 101 corresponding to the vias in the opaque layer 1. The first medium layer 2 includes two medium sub-layers 21 with a same refractive index.

With the trigonometric function relationships $\tan \beta \geq \tan C$, $\sin C = n_2/n_1$, and $\tan \beta = (2L-d)/h$, the following is obtained:

$$\frac{n_1}{n_2} > \sqrt{1 + \left(\frac{h}{2L-d}\right)^2}, \qquad 2)$$

where $n_1$ is a refractive index of the first medium layer 2, $n_2$ is a refractive index of the second medium layer 3, $n_1$ is greater than $n_2$, h is a thickness of the first medium layer, L is a period of the via in the opaque layer 1, and d is an aperture of the via.

For the opaque layer with the three-layer structure, light rays (for example, light ray 1 in FIG. 5) passing through some vias do not project to light ray receiving areas corresponding to other vias, without meeting the condition of total reflection, which does not cause interference between light rays. Although light rays (such as light rays 2 in FIG. 5) passing through some other vias pass through vias in the opaque layer, they cannot project to light ray receiving areas corresponding to other vias other than the some other vias due to the total reflection caused by a large angle α, and the light ray crosstalk does not occur. In addition, a large value of (2L−d) and a smaller minimal value of $n_2/n_1$ contribute to finding materials used to manufacture the first medium layer and the second medium layer to realize a total reflection.

When the first medium layer includes m medium sub-layers, and the third opaque sub-layer is arranged between every two adjacent medium sub-layers, m is a positive integer, greater than or equal to 3. The optical structure meets the following condition:

$$\frac{n_1}{n_2} \geq \sqrt{1 + \left(\frac{h}{mL-d}\right)^2} \quad 3)$$

where $n_1$ is a refractive index of the first medium layer 2, $n_2$ is a refractive index of the second medium layer 3, $n_1$ is greater than $n_2$, h is a thickness of the first medium layer, L is a period of the via in the opaque layer 1, and d is an aperture of the via.

If m≥3, since (mL−d) is greater than (2L−d), the minimal value of $n_2/n_1$ is smaller, which makes it easier to find materials used to manufacture the first medium layer and the second medium layer to realize a total reflection.

In some embodiments, as shown in FIG. 5, the optical structure includes an opaque layer 1, a first medium layer 2 and a second medium layer 3.

Both the first medium layer 2 and the second medium layer 3 are transparent and laminated. The second medium layer 3 is located at a light-exiting side of the first medium layer 2.

The opaque layer 1 includes a plurality of vias. Light rays passing through each via project to a light ray receiving area 101 corresponding to the each via.

The opaque layer 1 includes a first opaque sub-layer 11 and a second opaque sub-layer 12.

The first opaque sub-layer 11 is arranged between the first medium layer 2 and the second medium layer 3, and the first opaque sub-layer 11 includes a plurality of vias 41.

The second opaque sub-layer 12 is arranged at one side of the first medium layer 2 away from the second medium layer 3, and the second opaque sub-layer 12 includes a plurality of second vias 42.

The opaque layer 1 further includes a third opaque sub-layer 13, the first medium layer 2 includes two medium sub-layers 21 with a same thickness and a same refractive index, a third opaque sub-layer 13 is arranged between two adjacent medium sub-layers 21, and the third opaque sub-layer 13 includes a plurality of third vias 43.

The orthogonal projections of the third via 43, the second via 42 and the first via 41 onto the first medium layer 2 overlap completely. The vias in the opaque layer 1 consist of the first via 41, the second via 42 and the third via 43 which correspond to one another in position.

The optical structure meets the following condition:

$$\frac{n_1}{n_2} \geq \sqrt{1 + \left(\frac{h}{2L-d}\right)^2},$$

where $n_1$ is a refractive index of the first medium layer 2, $n_2$ is a refractive index of the second medium layer 3, $n_1$ is greater than $n_2$, h is a thickness of the first medium layer 2, L is a period of the via in the opaque layer 1, and d is an aperture of the via.

In the above-mentioned optical structure, the first medium layer includes two identical medium sub-layers, and the third opaque sub-layer is arranged between the two medium sub-layers, which enhances the effect of the third opaque sub-layer blocking light rays, such that light rays passing through some vias do not project to a light ray receiving area corresponding to one via other than the some vias due to the third sub-opaque layer working as a barrier, thereby avoiding interference between light rays passing through different vias, especially using the total reflection principle, and contributing to selecting materials of the first medium layer and the second medium layer to realize the total reflection. Also, the first via in the first opaque sub-layer is set to correspond to the second via in the second opaque sub-layer, which makes it better to control an angle which is a maximum angle between light rays projecting to the light ray receiving area, and a distribution accuracy of obtained light rays.

Figure 4A:
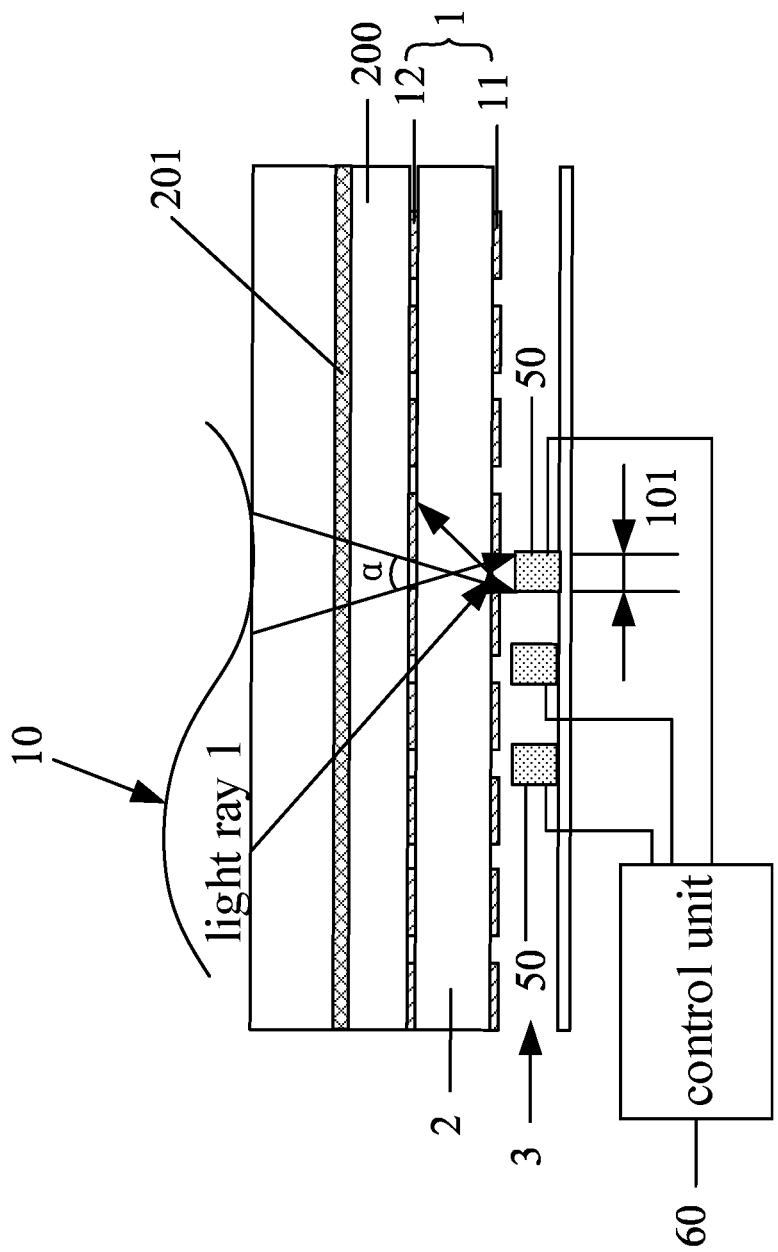
FIG. 4A is a schematic diagram of a display substrate according to some embodiments.
Figure 4B:
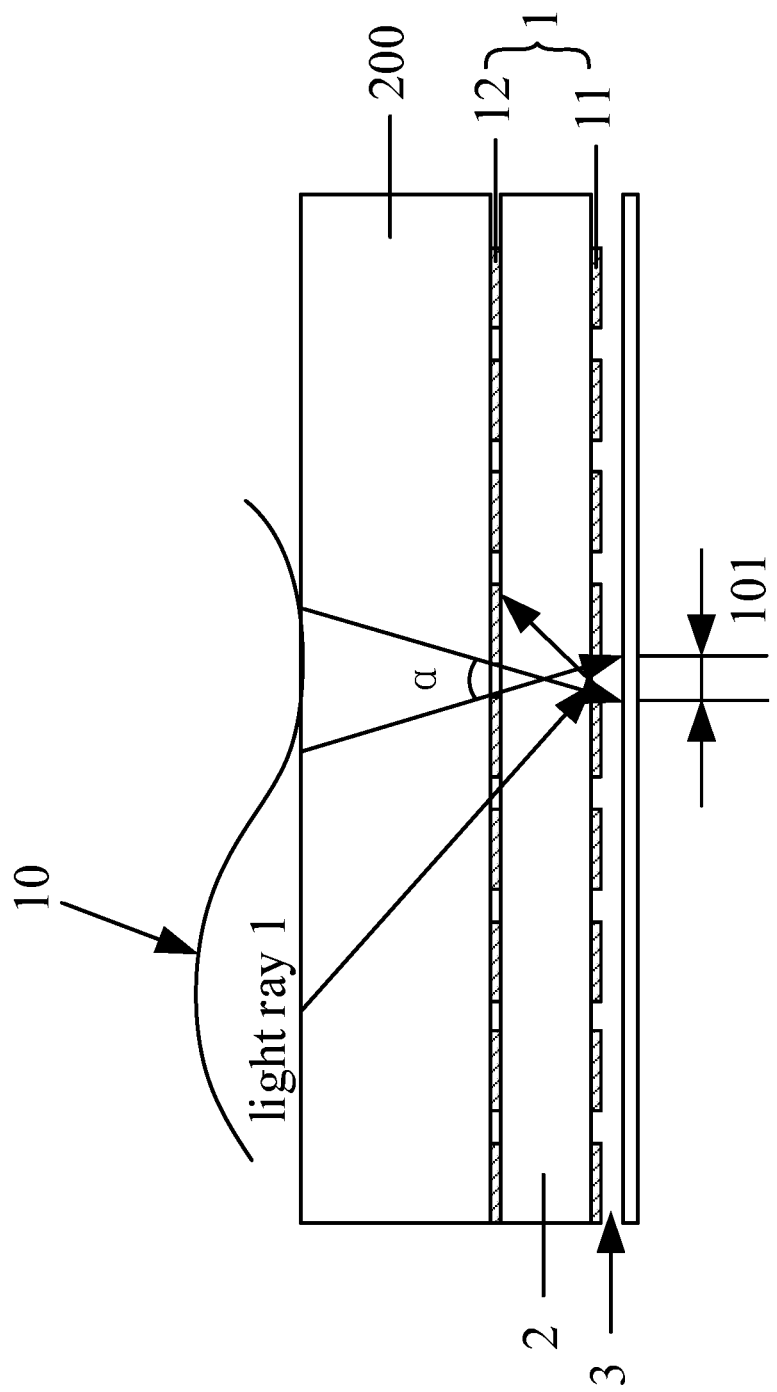
FIG. 4B is a schematic diagram of a display device including the optical structure as shown in FIG. 3 according to some embodiments.
Figure 6:
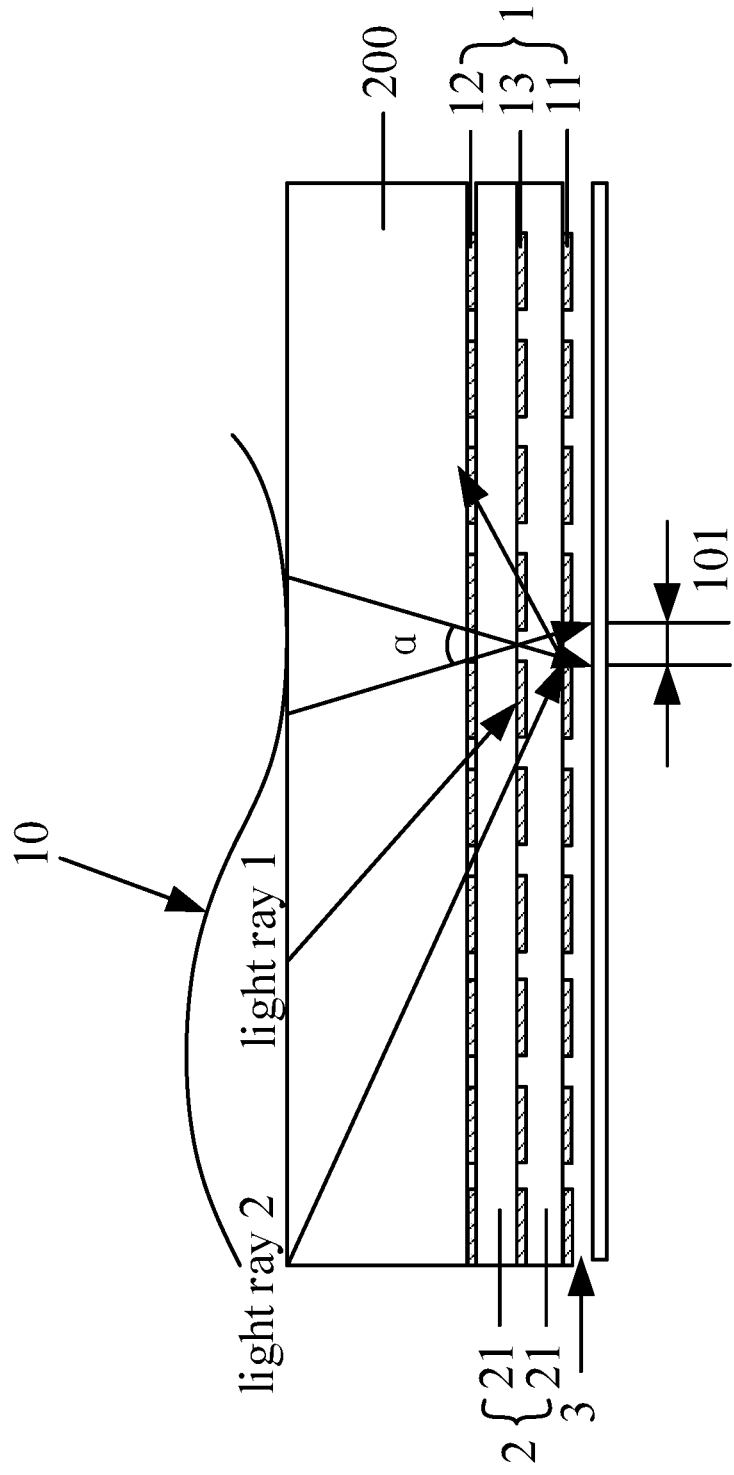
FIG. 6 is a schematic diagram of a display device including the optical structure as shown in FIG. 5 according to some embodiments.

In combination with FIGS. 4B and 6, some embodiments provide a display substrate and a display device. The display substrate 200 includes a base substrate and the optical structure according to any one of the above-mentioned embodiments, and the optical structure is arranged on the base substrate. The display device includes the display substrate.

In some embodiments, the display device includes a first substrate and a second substrate that are oppositely arranged to form a cell, where the first substrate is arranged close to a display side of the display device, and the second substrate is a display substrate. When a user touches the display device, light rays for display irradiate to a finger 10 of the user located at the display side, and light rays reflected by the finger 10 project to the light ray receiving area after passing through the optical structure on the first substrate, the second substrate and the third substrate.

In some embodiments, the display device further includes a control unit 60 and a plurality of optical sensing units 50. The optical sensing unit 50 is arranged in a corresponding light ray receiving area 101 respectively. Light rays reflected by the object 10 to be detected pass through the display substrate and the optical structure, and the optical sensing unit 50 is configured to receive the light rays passing through the display substrate and the optical structure. Connected with the optical sensing unit 50, the control unit 60 is configured to obtain a pattern of the object to be detected according to the light rays received by the optical sensing units 50.

In some embodiments, the object 10 to be detected is a user's finger, and the control unit obtains a fingerprint pattern of the user according to the light rays received by the optical sensing unit.

By arranging the optical structure, the display device with the above-mentioned technical solution limit an angle which is a maximum angle between light rays projecting to the optical sensing unit through vias, and reduce a distance between the finger and the optical sensing unit, thereby reducing a thickness of the whole display module. The optical structure leads light rays passing through each via to a light ray receiving area corresponding to the each via, thereby projecting light rays reflected by different areas of the finger to different light ray receiving areas corresponding to different vias after passing through the different vias, preventing interference between light rays, and obtaining a sharp image of the fingerprint.

In some embodiments, an OLED (Organic Light-Emitting Diode) display substrate serves as the display substrate. In some embodiments, the QLED (Quantum Dot Light-Emitting Diode) display substrate serves as the display substrate. In some embodiments, referring to FIG. 4A, the display substrate further includes an array structure 201 arranged on the base substrate, to implement a display process. For example, the array structure 201 includes a thin film transistor, an anode, a light emitting layer and a cathode. The light rays reflected by the object to be detected project to the optical structure through a gap between the array structures.

In some embodiments, the first medium layer 2 of the optical structure used as the base substrate, to simply the structure and reduce the thickness of the module.

In some embodiments, the optical structure is arranged at one side of the base substrate away from the array structure.

In some embodiments, in combination with FIGS. 4A, 4B and 6, the display device includes a display substrate 200, a plurality of optical sensing units 50, a control unit 60 and the optical structure according to any one of the above-mentioned embodiments.

The optical structure is arranged at one side of the display substrate 200 away from the display side. Light rays reflected by the finger 10 of user when touching the display substrate 200 pass through the display panel, and then enter into the optical structure.

Each optical sensing unit 50 is arranged in a corresponding light ray receiving area 101 respectively to one via of the optical structure. The optical sensing unit 50 is configured to receive light rays of one area of the fingerprint passing through the display panel and the optical structure.

Connected with the optical sensing unit 50, the control unit 60 is configured to obtain a fingerprint pattern of a user according to light rays received by the optical sensing unit 50. By adopting the optical structure according to any one of the above-mentioned embodiments, the above-mentioned display device limits an angle which is a maximum angle between light rays which is reflected by the fingerprint and project to the optical sensing unit, reduces a distance between the finger and the optical sensing unit, and decreases the thickness of the whole module. Meanwhile, the light rays from different areas of the finger are prevented from projecting to a same optical sensing unit of one light ray receiving area, thereby avoiding interference between light rays, and obtaining a sharp image of the fingerprint.

Based on a distance between the valley and the ridge of the fingerprint ranging from 200 μm to 300 μm, the period L of vias in the opaque layer of the optical structure is set to be L≤200 μm. In order to obtain the fingerprint pattern more accurately and improve safety, it is set that 25 μm≤L≤50 μm.

In some embodiments, in combination with FIGS. 4B and 6, the opaque layer 1 of the optical structure has a three-layer structure. The opaque layer 1 includes a first opaque sub-layer 11, a second opaque sub-layer 12 and a third opaque sub-layer 13.

The first opaque sub-layer is arranged between the first medium layer 2 and the second medium layer 3, and the first opaque sub-layer 11 includes a plurality of vias 41.

The second opaque sub-layer 12 is arranged at one side of the first medium layer 2 away from the second medium layer 3, and the second opaque sub-layer 12 includes a plurality of second vias 42.

The first medium layer 2 includes two medium sub-layers 21 with a same thickness and a same refractive index, a third opaque sub-layer 13 is arranged between two adjacent medium sub-layers 21, and the third opaque sub-layer 13 includes a plurality of third vias 43.

The orthogonal projections of the third via 43, the second via 42 and the first via 41 onto the first medium layer 2 overlap completely. The vias in the opaque layer 1 consist of the first via 41, the second via 42 and the third via 43 which correspond to one another in position.

In the above-mentioned display device, the first medium layer includes two identical medium sub-layers, and the third opaque sub-layer is arranged between the two medium sub-layers, which enhances the effect of the third opaque sub-layer blocking light rays, avoids interference between light rays, especially using the total reflection principle, and contributes to selecting the materials of the first medium layer and the second medium layer to realize the total reflection. Also, the first via in the first opaque sub-layer is set to correspond to and the second via in the second opaque sub-layer, which makes it better to control the angle which is a maximum angle between light rays projecting to the light ray receiving area, adjust a distribution accuracy of obtained light rays and improve accuracy of obtained fingerprint image.

The optical structure in the above-mentioned embodiment is suitable for identifying human faces or other biological features, or obtaining optical images of other objects.

Figure 7:
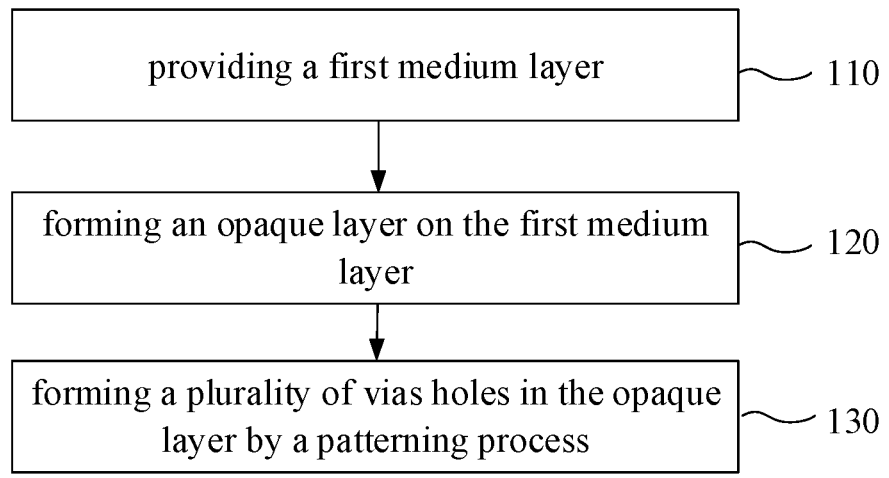
FIG. 7 is a flow chart of a method for manufacturing an optical structure according to some embodiments.

Some embodiments provide a method for manufacturing an optical structure. Referring to FIG. 7, the method includes steps 110, 120 and 130.

In step 110, a first medium layer is provided.

In step 120, an opaque layer is formed on the first medium layer.

In step 130, a plurality of vias is formed in the opaque layer by a patterning process.

For example, the opaque layer is made of a black resin material, and vias is formed on the opaque layer by one-time patterning process. In some embodiments, the patterning process includes steps such as exposing and developing.

What is claimed is:

1. An optical structure, comprising:
   a first medium layer being transparent; and
   an opaque layer arranged on the first medium layer and comprising a plurality of vias;
   wherein the optical structure is configured to allow light rays passing through each of the plurality of vias to project to a corresponding light ray receiving area respectively;
   wherein the opaque layer comprises:
      a first opaque sub-layer arranged on a first surface of the first medium layer and comprising a plurality of first vias; and
      a second opaque sub-layer arranged on a second surface of the first medium layer, wherein the second surface is opposite to the first surface, and the second opaque sub-layer comprises a plurality of second vias;
   wherein an orthogonal projection of one first via of the plurality of first vias onto the first medium layer partially or completely overlaps with an orthogonal projection of one second via of the plurality of second vias onto the first medium layer, and the second via of the plurality of second vias is closest to the first via of the plurality of first vias.

2. The optical structure according to claim 1, further comprising a second medium layer being transparent, wherein the second medium layer is located at a light-exiting side of the first medium layer;
   the optical structure meets the following condition:

$$\frac{n_1}{n_2} \geq \sqrt{1 + \left(\frac{h}{L-d}\right)^2},$$

$n_1$ is a refractive index of the first medium layer, $n_2$ is a refractive index of the second medium layer, h is a thickness of the first medium layer, L is a period of the plurality of vias, d is an aperture of each of the plurality of vias, and $n_1$ is greater than $n_2$.

3. The optical structure according to claim 1, wherein the opaque layer comprises a third opaque sub-layer,
- the first medium layer comprises at least two medium sub-layers,
- the third opaque sub-layer is arranged between every two adjacent medium sub-layers of the at least two medium sub-layers,
- the third opaque sub-layer comprises a plurality of third vias, and
- orthogonal projections of one third via of the plurality of third vias, one second via of the plurality of second vias and one first via of the plurality of first vias, onto the first medium layer partially or completely overlap with one another.

4. The optical structure according to claim 3, further comprising a second medium layer being transparent,
- wherein the second medium layer is located at a light-exiting side of the first medium layer, and the first medium layer comprises m medium sub-layers;
- the optical structure meets the following condition:

$$\frac{n_1}{n_2} \geq \sqrt{1+\left(\frac{h}{mL-d}\right)^2},$$

- wherein all the m medium sub-layers have a refractive index of $n_1$, $n_2$ is a refractive index of the second medium layer, h is a thickness of the first medium layer, L is a period of the plurality of vias, d is an aperture of each of the plurality of vias, $n_1$ is greater than $n_2$, and m is greater than or equal to 2.

5. The optical structure according to claim 4, wherein 25 µm≤L≤50 µm.

6. The optical structure according to claim 4, wherein the at least two medium sub-layers have a same thickness.

7. The optical structure according to claim 1, wherein distances between every two adjacent vias of the plurality of vias in the opaque layer are the same.

8. The optical structure according to claim 1, wherein the first medium layer is made of glass or polyimide.

9. A display substrate, comprising a base substrate and the optical structure according to claim 1, wherein the optical structure is arranged on the base substrate.

10. The display substrate according to claim 9, wherein the first medium layer serves as the base substrate.

11. The display substrate according to claim 9, wherein the base substrate comprises an array structure, and the optical structure is arranged on one side of the base substrate away from the array structure.

12. The display substrate according to claim 9, wherein the display substrate comprises an organic light-emitting diode (OLED) display substrate or a quantum-dot light-emitting diode (QLED) display substrate.

13. A display device, comprising:
- the display substrate according to claim 9;
- a plurality of optical sensing units, configured to receive light rays reflected by an object to be detected and passing through the display substrate and the optical structure, wherein each of the plurality of optical sensing units is arranged in a corresponding light ray receiving area respectively; and
- a control unit, connected with the plurality of optical sensing units and configured to obtain a pattern of the object to be detected according to the light rays received by the plurality of optical sensing units.

14. The display substrate according to claim 9, wherein the optical structure further comprises a second medium layer being transparent,
- wherein the second medium layer is located at a light-exiting side of the first medium layer;
- the optical structure meets the following condition:

$$\frac{n_1}{n_2} \geq \sqrt{1+\left(\frac{h}{L-d}\right)^2},$$

$n_1$ is a refractive index of the first medium layer, $n_2$ is a refractive index of the second medium layer, h is a thickness of the first medium layer, L is a period of the plurality of vias, d is an aperture of each of the plurality of vias, and $n_1$ is greater than $n_2$.

15. The display substrate according to claim 9, wherein the opaque layer comprises a third opaque sub-layer,
- the first medium layer comprises at least two medium sub-layers,
- the third opaque sub-layer is arranged between every two adjacent medium sub-layers of the at least two medium sub-layers,
- the third opaque sub-layer comprises a plurality of third vias, and
- orthogonal projections of one third via of the plurality of third vias, one second via of the plurality of second vias and one first via of the plurality of first vias, onto the first medium layer partially or completely overlap with one another.

16. The display substrate according to claim 15, wherein the optical structure further comprises a second medium layer being transparent,
- wherein the second medium layer is located at a light-exiting side of the first medium layer, and the first medium layer comprises m medium sub-layers;
- the optical structure meets the following condition:

$$\frac{n_1}{n_2} \geq \sqrt{1+\left(\frac{h}{mL-d}\right)^2},$$

- wherein all the m medium sub-layers have a refractive index of $n_1$, $n_2$ is a refractive index of the second medium layer, h is a thickness of the first medium layer, L is a period of the plurality of vias, d is an aperture of each of the plurality of vias, $n_1$ is greater than $n_2$, and m is greater than or equal to 2.

17. The display substrate according to claim 16, wherein 25 µm≤L≤50 µm.

18. The display substrate according to claim 9, wherein distances between every two adjacent vias of the plurality of vias in the opaque layer are the same.

* * * * *